United States Patent [19]

Takeuchi

[11] Patent Number: 5,037,504
[45] Date of Patent: Aug. 6, 1991

[54] METHOD OF FORMING FINE PATTERNS

[75] Inventor: Satoshi Takeuchi, Tokyo, Japan

[73] Assignee: Dai Nippon Insatsu Kabushiki Kaisha, Japan

[21] Appl. No.: 553,565

[22] Filed: Jul. 18, 1990

[30] Foreign Application Priority Data

Jul. 25, 1989 [JP] Japan .................................. 1-192180
Apr. 18, 1990 [JP] Japan .................................. 2-102421

[51] Int. Cl.$^5$ ...................... H01L 21/306; C23F 1/02; B44C 1/22; C03C 15/00
[52] U.S. Cl. ................................... 156/630; 156/631; 156/634; 156/643; 156/656; 156/657; 156/659.1; 156/151; 156/241; 156/902; 156/904; 204/17
[58] Field of Search ...................... 204/6, 17; 156/630, 156/631, 632, 643, 646, 633, 634, 656, 657, 659.1, 662, 664, 150, 151, 233, 235, 240, 241, 901, 902, 904, 905

[56] References Cited

U.S. PATENT DOCUMENTS 2,666,008   1/1954   Enslein et al. ................. 204/17 X
4,746,399   5/1988   Demmer et al. .............. 156/904 X
4,861,438   8/1989   Banks et al. .................. 156/904 X Primary Examiner—William A. Powell
Attorney, Agent, or Firm—Parkhurst, Wendel & Rossi

[57] ABSTRACT

A fine pattern is formed by the following steps. A prescribed mask pattern of an electrically insulative material is formed on an electroconductive surface of a base plate of a printing plate, so that the part, other than the mask pattern, of the printing plate becomes an electroconductive printing pattern part. Then, electrolysis is carried out in an electrolyte containing an electrodeposition substance as an ingredient with the printing plate as one electrode and with an opposing electrode, both immersed in the electrolyte, so that the electrodeposition substance is deposited on the electroconductive printing pattern part of the printing plate. Thereafter, the printing plate is withdrawn out from the electrolyte, washed and dried. Then, the deposited substance is transferred onto the surface of a printing object such as a plate of glass or plastic, for forming a pattern thereon. Thereafter, the surface of the printing object is etched with the electrodeposited substance thus transferred as an erosion resistant material. The transfer of the electrodeposition substance without consistency from the printing plate onto the surface of the printing object, followed by etching of the printing object surface, enables an accurate reproduction of a fine pattern on the printing object.

7 Claims, 2 Drawing Sheets

METHOD OF FORMING FINE PATTERNS

BACKGROUND OF THE INVENTION

This invention relates to methods of forming images in which the image elements (e.g., lines) are highly precise and ultraminute. More particularly, the invention concerns a method of forming fine patterns by which fine patterns such as those of fine circuits used in semiconductor elements can be formed with high reliability and moreover on a quantity production scale.

Among the numerous applications with which the present invention is concerned are the printing of electrical wirings and the formation of electrical circuits on substrates or base plates of materials such as glass and ceramics. Heretofore, such forming of image patterns have been carried out by processes such as photolithography, screen printing, and offset printing.

With the advancements in electronics, however, there has been an ever-growing demand for further improvements in the fineness and precision of image elements (lines) of patterns constituting electronic elements and components. Accordingly, methods involving the use of photolithography, by which very fine image elements can be formed, have heretofore been widely adopted. However, the throughputs of such methods relying on photolithography have been poor, whereby the production cost has been unavoidably high.

As a measure for lowering this cost, there has been a need for the development of a printing method which is adaptable to and highly effective for quantity production. The printing methods being utilized at present are the screen printing method, the offset printing method, and the like. The image elements that can be formed by these methods, however, are relatively wide, and it is extremely difficult to obtain image elements of fine widths. In fact, forming such fine elements has been impossible.

For example, the screen printing method comprises forming an ink shielding mask on a mesh-form screen so that the non-masked parts delineate the desired pattern and causing the ink to pass though the non-masked parts thereby to print the desired pattern on an object being printed (hereinafter referred to as "printing object"). By this method, an ink thickness of a number of $\mu$m to 20 $\mu$m can be obtained. For this reason, printing of resist patterns with excellent erosion resistance becomes possible. However, the practical image element (line) width is of the order of 0.1 to 0.2 mm. Therefore, intricate and fine patterns required for semiconductor integrated circuits and other uses cannot be printed by this method.

The offset printing method mentioned above comprises forming lipophilic parts and hydrophilic parts on a presensitized plate (PS plate), causing the hydrophilic parts to hold water and repel an oil-based ink thereby causing the ink to adhere selectively to only the lipophilic parts to form the desired ink pattern, and transferring this ink pattern onto the printing object. In order to improve the printing adaptability of this method, the general method is to first transfer the ink pattern on the PS plate once onto a rubber blanket and then to retransfer the pattern onto the printing object. By this offset printing, relatively fine image elements can be obtained, but, mainly because the ink transfer is carried out twice, the ink film thickness is thin, being of the order of 1 to 2 $\mu$m. As a consequence, there arises the problem of pinholes and line breakages readily occurring in the printed image elements.

Accordingly, numerous proposals and attempts have been made by applying various improvements to the offset printing method to increase the ink film thickness and thereby obtain patterns of excellent erosion resistance. However, increasing the ink film thickness inevitably gives rise to an increase in the width of the printed image elements. As a result, the lower limit of the width of the image elements which can be attained by these printing methods in the present state of the art is said to be of the order of 0.1 to 0.2 mm.

It can therefore be said that, by the printing methods as practiced heretofore in the above described manner, highly precise and fine patterns cannot be formed. One of the major reasons for this is that a printing ink passes consistency and even fluidity in some cases.

The consistency or tackiness of a printing ink is ordinarily an indispensable property for printing but becomes a disadvantage in the case where a precise and fine printed pattern is to be formed. More specifically, in the case where the ink is soft, it becomes stretched under pressure or flows when it is being transferred onto a printing object. Consequently, the figures of ink on the printing plate cannot be maintained, and the image transferred onto the printing object differs considerably from the image initially formed on the printing plate. Moreover, the magnitude of this discrepancy fluctuates greatly with the ambient conditions, whereby it is extremely unstable. For such reasons, conventional printing methods cannot be utilized for patterning which requires fineness and, moreover, high precision.

Furthermore, together with the fluctuation of the width of printing image elements at the time of transfer, the fluctuation of the ink film thickness is also large. Consequently, the reliability of the printing with respect to requirements such as chemical resistance and absence of pinholes in the resulting pattern is also poor. These difficulties have been a great problem.

SUMMARY OF THE INVENTION

Accordingly it is an object of this invention to overcome the difficulties of the above problem in the conventional printing methods, as specifically enumerated below.

1. Difficulty of accurate and positive inking of the image element parts of the printing plate.
2. Fluctuations of the ink image element width and ink film thickness during transfer of the ink from the printing plate after inking.
3. High frequency of defective image elements such as broken lines, short circuiting, and pinholes.
4. Impossibility of obtaining highly precise and intricate image elements.

That is, an object of the present invention is to overcome these difficulties by providing a method of forming fine patterns to replace photolithography, by which method, highly precise and, moreover, fine patterns can be formed on a quantity-production scale.

The above enumerated difficulties have been overcome in accordance with the present invention.

In the conventional printing method wherein a viscous ink is used for inking image elements formed on a printing plate, the inking step is carried out by an action comprising rubbing the ink against the image element parts. In the case where inking is carried out in this manner by using physical force, however, various forces such as pressing force, sliding (rubbing) force, and tensile force act in a complex manner, which is a general characteristic of viscous materials. As a consequence, accurate and positive inking of the image element parts of the printing plate cannot be carried out. It is therefore clear that, in order to accomplish faithful inking of the image elements, the inking must be carried out in a perfectly static manner so as to prevent the various physical forces mentioned above from acting.

Accordingly, in the method of forming fine patterns according to this invention, inking is accomplished in a perfectly static manner by an electrodeposition process wherein an ink component is deposited electrically. More specifically, the method of forming fine patterns according to the present invention comprises depositing an electrodeposition substance on image elements formed on a printing plate surface thereby to create an electrodeposition pattern in a completely static manner and transferring the image elements of the electrodeposition substance thus formed, without distortion or deformation, onto the surface of a printing object.

According to the present invention, generally defined, there is provided a method of forming fine patterns which comprises: forming a prescribed mask pattern with an electrically insulative material on a surface of a base plate, at least said surface having electroconductivity, thereby to form a printing plate having an electroconductive printing pattern parts; carrying out electrolysis in an electrolyte containing an electrodeposition substance as an ingredient, with said printing plate as a first electrode and an opposing second electrode both immersed in said electrolyte thereby to deposit said electrodeposition substance on said electroconductive printing pattern parts of the printing plate; then withdrawing said printing plate out from said electrolyte; thereafter transferring said deposited electrodeposition substance onto the surface of a printing object to be printed for forming a pattern on the object; and then etching the surface of said printing object by using the electrodeposition substance thus transferred as an erosion resistant material.

The nature, utility, and further features of the present invention will be more clearly apparent from the following detailed description when read in conjunction with the accompanying drawings.

DESCRIPTION OF THE PREFERRED EMBODIMENTS

Figure 1A:
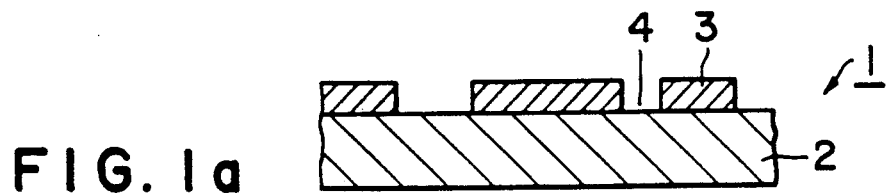
FIGS. 1a, 1b, and 1c are fragmentary sectional views respectively showing examples of printing plates.
Figure 1B:
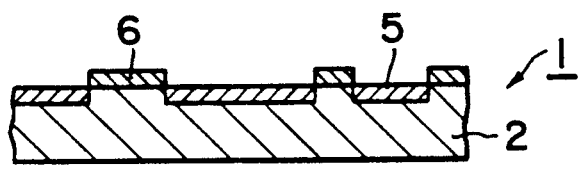
Figure 1C:
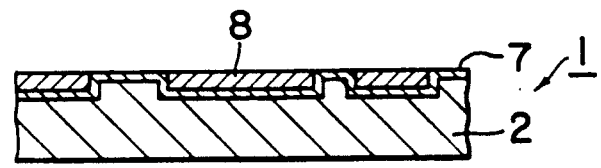

FIGS. 1a, 1b, and 1c show schematically the structural organizations of printing plates. For the practice of this invention, these printing plates 1 are fabricated in the following manner.

The printing plate shown in FIG. 1a has a desired resist pattern 3 formed by an ordinary photolithographic method, which comprises coating the upper surface of an electroconductive base plate 2 with a photoresist, exposing to light a desired image pattern thereon, developing and drying the pattern, and further carrying out baking as necessary. For the electroconductive base plate 2, a material which itself is electroconductive, such as a metal plate, may be used. Alternatively, a non-electroconductive material having conductivity imparted thereto on at least its working or printing surface may be used. Such a base plate may be prepared, for example, by coating a base plate made of a nonelectroconductive material with a conductive layer such as tin oxide, indium-tin oxide (ITO), or carbon. This conductive layer can be applied by means of an adhesive, by coating, or by evaporation deposition.

The conductive surface is preferably in a state whereby the adhesive strength obtained will be of an order such that the electrodeposited substance precipitated in a subsequent electrolytic reaction process step will adhere with a suitable adhesive strength and, moreover, can peel off readily in a later transfer process step. Therefore the printing surface of the base plate 2 is processed to a mirror finish to some extent and used in a state wherein the adhesive strength has been weakened. In view of the above preferences, in the case where the material of the base plate 2 is a metal, a base plate comprising a stainless-steel plate or a copper plate plated with nickel or chromium is desirable since it possesses a suitable adhesive strength. For the photoresist, a resist of high electrical insulation resistance is used.

By the above described process, the base plate 2 is formed thereon with a photoresist pattern 3 having electrically insulative property and image element parts 4 having exposed electroconductive surfaces on which electrodeposited substances will be precipitated by electrolysis reaction.

The printing plate shown in FIG. 1b is fabricated in the following manner. Recesses are formed on an electrically insulative base plate 2 by a process such as photoetching or mechanical engraving. Then these recesses are filled with a substance 5 of good adhesiveness and high electrical insulative resistance. Thereafter the printing surface is plated with hard chromium to form a chromium layer 6. The recesses filled with the substance 5 form non-image-element parts, while the parts on which the chromium layer 6 is formed form image element parts. By carrying out plating with hard chromium in this manner, printing repeatability, that is, resistance to repeated printing operation can be improved.

The printing plate 1 shown in FIG. 1c is fabricated in the following manner. First, recesses are formed on an electrically insulative base plate 2 similarly as described above in conjunction with FIG. 1b. Next, the entire working surface of this base plate 2 with the recesses formed therein is plated with hard chromium to form a chromium layer 7. Successively the recesses are filled with a substance 8 having good adhesiveness and moreover high electrical insulative resistance. The exposed parts of the chromium layer 7 form image element parts.

The following description is set forth with respect to the use of the printing plate 1 illustrated in FIG. 1a. It will be obvious that similar results can be expected also through the use of the printing plate shown in FIG. 1b or FIG. 1c.

Figure 2:
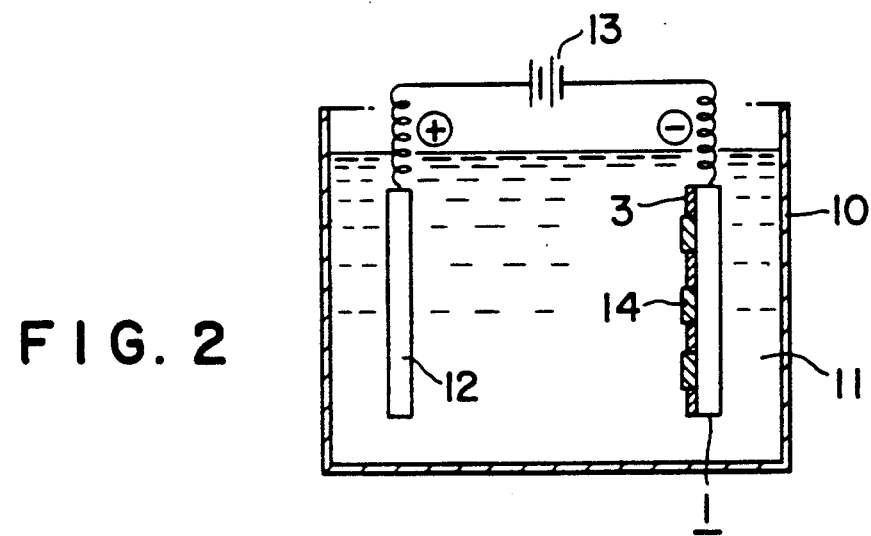
FIG. 2 is a side elevation in section for a description of the deposition of an electrodeposition substance by electrolysis.
Figure 3:
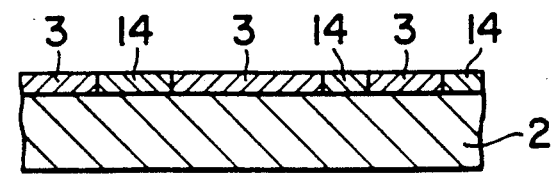
FIG. 3 is a fragmentary sectional view showing the state wherein an electrodeposition substance has been deposited on a printing plate.

As shown in FIG. 2, after a printing plate has been formed in the above described manner, an electrolyte 11 containing an electrodeposition substance ingredient is placed in a suitable electrolysis tank 10. The printing plate 1 is then immersed and suspended in this electrolyte 11 as a first electrode. An electroconductive member 12 made of an appropriate material is similarly immersed and suspended in the electrolyte 11 as a second electrode at a position spaced apart from and confronting the first electrode 1. A direct-current power supply source 13 is then connected between the first and second electrodes. The electrolysis is carried out under suitable conditions of electrical voltage and current. By this process, an electrodeposited substance 14 is precipitated on the image element parts 4 of the printing plate of FIG. 1a as shown in FIG. 3.

The material to be utilized for the substance to be electrodeposited is, of course, a material exhibiting electrochemical behavior and being capable of depositing on the first electrodes. In general, metals are well known as being electroplating materials. As metals, general purpose materials are widely utilized. In the practice of the present invention, however, the utilization of any of Ni, Cr, Fe, Ag, Au, Cu, Zn, and Sn, and combinations thereof with other substances such as compounds and alloys thereof are preferable. The reason for this is that the characteristics of these metals after electrodeposition, such as film-forming property, shielding property of thin film, and resolution are good.

Separately, electrodepositable substances of organic materials (high polymer materials) are also known. In the past, there has been a report on a process wherein various vinyl compounds are polymerized electrochemically on an Fe electrode to obtain high-polymer films. (Kinzoku Hyōmen Gijutsu (Metal Surface Technology), vol. 19, No. 12, published in Japan in 1968). Recently, research on the forming of electroconductive high-polymer films of polypyrrole or polythienylene from pyrrole or thiophene on electrodes is being carried out.

Another method is the method of insolubilization deposition of a high polymer from a solution of that high polymer onto an electrode. For example, the electrodeposition coating (painting) method is well known wherein a coloring pigment is dispersed in a high-polymer solution, which is then applied as a color coating onto an electrode. Therefore, materials developed and used for electrodeposition painting of the bodies of automotive vehicles can generally be used.

Depending on the reaction with the main electrode, which is the electrodeposition electrode, the process is a cation electrodeposition or an anion electrodeposition. This classification is based on whether the electrodeposited substance exists as a cation or whether it behaves as an anion.

Examples of organic high-polymer substances suitable for use in this electrodeposition are natural oils and fats, synthetic oils, alkyd resins, polyester resins, acrylic resins, and epoxy resins.

For an anion type process, resins such as maleic resins and polybutadiene resins have been known from the past. Setting of such a resin is by oxidation polymerization reaction.

A cation type process is widely used in general for electrodeposition coating. There are numerous epoxy resins, each being utilized singly by itself or in a modified form. For setting, an isocyanate-based crosslinking agent is often used. In addition there are many so-called polyamine resins such as polybutadiene resins, melamine resins and acrylic resins.

These electrodeposited films are set by reactions such as oxidation polymerization or heating polymerization or photocrosslinking. Particularly as an electrodepositable resin of the type which can be set by ultraviolet ray irradiation, the use of anionic acrylic resins for formation of negative type images has been reported.

The electrodeposited fine pattern according to this invention is formed as a film of a metal or an organic resin on the surface of an electroconductive pattern base plate. This electrodeposited substance, however, does not possess adhesiveness, in general. As was mentioned hereinbefore, with a sticky substance possessing adhesiveness or tackiness, an accurate reproduction of the pattern cannot be made at the time of transfer onto the print object. Therefore the use of a solid pattern in order to prevent deformation or distortion of the pattern due to pressure or some other external force is a unique characteristic. Thus the pattern substance, itself, does not have any adhesiveness or tackiness whatsoever. Even though it may have such a property, it is slight.

For this reason, in order to transfer the deposited electrodeposited substance, it is necessary to supplement a posteriori adhesiveness or tackiness. One measure for accomplishing this is to coat the surface of the print object or the surface of the electroconductive pattern base plate after the electrodeposition with a tacky adhesive or an adhesive.

Examples of substances suitable for use as a tacky adhesive are generally used tacky adhesives such as vinyl acetate chlorides, natural and synthetic rubbers, various acrylate and epoxy resins, heat-sensitive adhesives that are thermoplastic, and photosetting adhesives.

The non-image-element parts of the adhesive layer formed for transferring the electrodeposited pattern are unnecessary for etching the printing object surface. Therefore, the adhesive layer of the non-image-element parts must be removed. A method for this purpose is the dry etching method, and the utilization of the plasma carbonization process in the presence of oxygen is convenient. In this case, organic electrodeposited substances are also carbonized. However, since the electrodeposited layer is thicker than the adhesive layer, even if the rates of carbonization of both are of the same order, the adhesive layer will be removed first.

In actual practice it is possible to select the electrodeposition agent and to admix a material of slow carbonization rate or a substance that cannot be carbonized, for example, a minute quantity of an inorganic material, thereby to impart resistance to carbonization.

In the case where the electrodeposition substance is a metal, the base plate surface for electrodeposition is subjected to an appropriate exfoliation or peeling treatment, or an electroconductive surface of low affinity relative to the metal to be deposited is formed. By such a measure, adhesiveness which facilitates electrodeposition and transfer onto the printing object can be obtained. For example, a metal base plate relative to which the adhesiveness of electrodeposited metals is intrinsically poor such as stainless-steel plate or a chromic acid treated surface, a mirror nickel-plated surface, or a chromium plated surface is used.

On the other hand, an organic electrodeposition material used for this purpose, which is a material basically for electrodeposition coating, exhibits good adhesiveness with respect to the electrodeposition base plate in many cases. In such cases, even when electrodeposition substance on the base plate surface has been thus deposited over a layer of an adhesive for transferring, the adhesion with the base plate may be excessively strong. Consequently, peeling off and transferring may not occur, or transferring with partial breakage of the pattern may occur. Thus a good image transfer cannot be achieved in some instances.

In such a case, the difficulty can be overcome by first electrodepositing thinly a film of a metal of low affinity relative to the base plate metal and of good peelability as a primary deposit and by thereafter electrodepositing the objective organic substance as a secondary deposit. When transferring is carried out over an interposed adhesive layer, this transferring is accomplished by the facility of the peeling between the base plate and the primary electrodeposited metal layer. After the transfer, the layers assume a state wherein the organic deposited substance is covered by the primary deposited metal layer.

Accordingly, by removing by etching the primary deposited metal layer after the transfer, the pattern of the objective organic electrodeposited substance is obtained. Because this transfer is carried out with the covering of the primary electrodeposited metal layer, an excellent pattern image without damage or deformation of the electrodeposited substance can be obtained.

For the primary deposit metal for facilitating this transfer accompanied by peeling, all of the metals enumerated hereinbefore as peelable electrodeposition metals for general use can be utilized. However, it is preferable to use a metal which can be readily etched with an etching liquid that is not very dangerous at the time of the etching removal after transfer. Metals such as Ag, Ni, and Cu are metals that are most readily utilized, but this invention is not intended to be limited thereto.

By the practice of the above described method of a peelable primary metal electrodeposition, a 100% transfer can be accurately and positively achieved even with a material of relatively poor film-forming properties at the time of electrodeposition. Therefore, an image without unevenness in the form of pinholes and lines can be obtained.

After the electrodeposition substance has been deposited in the above described manner, the printing plate 1 is washed and dried as necessary. Next, the electrodeposited substance which has been deposited is transferred directly or indirectly onto a printing object comprising a suitable base plate prepared separately from the printing plate 1. For indirect transfer, one method, for example, comprises first transferring the electrodeposited substance deposited on the printing plate once onto a blanket for offset printing and then retransferring the substance from the blanket onto a specific printing object.

As for the printing object after transfer of the electrodeposited pattern, with the electrodeposited pattern used as an erosion resist, the printing object is etched directly, or only a thin film material layer formed beforehand on the printing object is etched, to form a fine pattern made of the desired material. Thereafter removal of unnecessary material is carried out with a suitable removal agent such as a film-peeling solution containing concentrated sulfuric acid as the principal ingredient thereof.

Figure 4A:
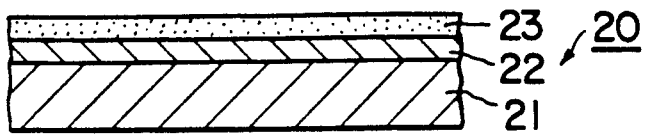
FIGS. 4a through 4g are fragmentary section views for descriptions of transferring of an electrodeposition substance deposited on a printing plate onto a printing object and of the method of forming a fine pattern on the printing object.

This process will now be described more specifically with reference to FIGS. 4a through 4f. As shown in FIG. 4a, a printing object 20 comprises a base plate 21 made of a suitable material such as glass or a plastic, a thin film layer 22 and an adhesive layer 23 laminated in the order named on the base plate 21. The thin film layer 22 is formed from, for example, a transparent electroconductive material, a metal, or a semiconductor. The adhesive layer 23 is formed from a suitable adhesive or a tacky adhesive.

Figure 4B:
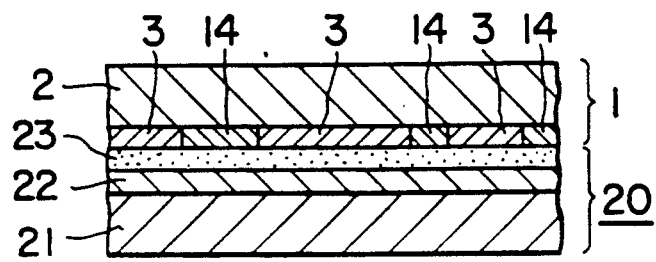

A printing plate 1 on which an electrodeposition substance 14 has been deposited as shown in FIG. 3 is prepared. Then, as shown in FIG. 4b, the adhesive layer 23 of the printing object 20 and the surface of the printing plate 1 having thereon the electrodeposition substance 14 are brought together into intimate contact. Then the printing plate 1 and the printing object are pulled apart to cause peeling. As a consequence, as shown in FIG. 4c, the pattern of the electrodeposition substance 14 on the printing plate 1 is transferred accurately and positively onto the printing object 20.

On the other hand, the printing plate 1 returns to its state indicated in FIG. 1a. For this reason, the electrolysis process shown in FIG. 2 can again be carried out. That is, the printing plate 1 can be used repeatedly any number of times.

Figure 4C:
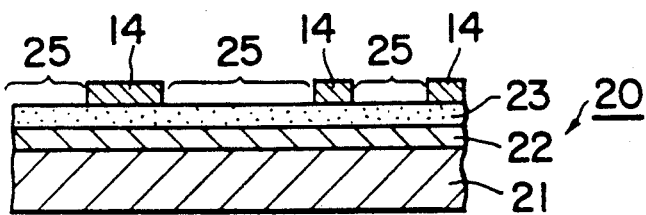
Figure 4D:
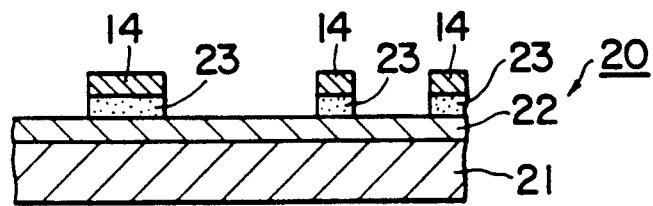

Next, with the printing object in the state indicated in FIG. 4c, the adhesive layer 23 of the non-image-element parts designated by reference numerals 25 is removed. This removal, as shown in FIG. 4d, produces a two-layer image pattern in which the adhesive layer 23 remains below the image pattern formed by the electrodeposited substance 14. Then, the removal of the adhesive layer 23 can be carried out simply and accurately by utilizing a plasma carbonization method generally referred to as a dry method or any of various so-called dry etching methods. In this case, the pattern of the electrodeposited substance 14 is functioning as a shielding mask against an activated gas.

If the adhesive layer 23, for some reason such as its possessing photosensitivity, is capable of being selectively activated by irradiation, it can be removed also by a wet-type treatment wherein exposure to light and development is carried out. That is, in the case where the adhesive layer 23 is formed from a photosoluble material, by exposing this adhesive layer 23 in the state shown in FIG. 4c to light having an appropriate wavelength and then developing, the state indicated in FIG. 4d can be obtained. In the case where the adhesive layer 23 is formed from a photosetting material, this layer 23 in the state indicated in FIG. 4c is exposed to light of a suitable wavelength and developed thereby to obtain the state indicated in FIG. 4e.

In this connection, it will be obvious that, in the case where the adhesive layer 23 is to be made from a material possessing photosensitivity, it is necessary to form the pattern of the electrodeposited substance 14 in reverse with respect to the case where the adhesive layer 23 is photosoluble and the case where it is photosetting.

Figure 4E:
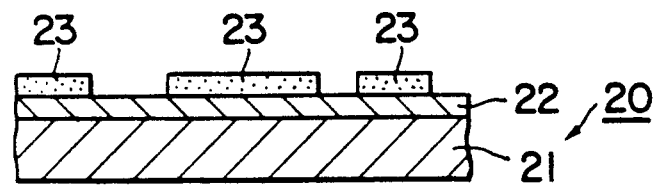
Figure 4F:
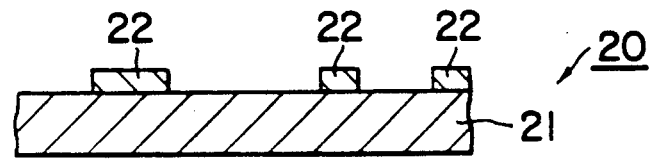
Figure 4G:
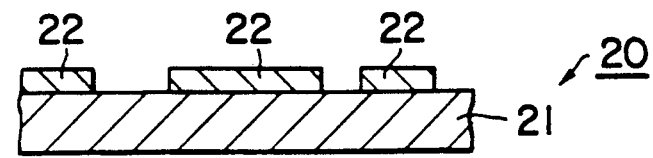

Next, with the printing object in the state shown in FIG. 4d or 4e, etching is carried out with the pattern of the adhesive layer 23 as a mask thereby to form in the thin film layer 22 the same pattern as that of the electrodeposited substance 14. Then the adhesive layer 23 is removed, whereupon a pattern of the thin film layer 22 as shown in FIG. 4f or 4g is obtained. Thus a fine image is formed. The etching of the thin film layer 22 and the removal of the adhesive layer 23 can be carried out by conventional techniques.

In the manner described above, an image of an electrodeposited substance on a printing plate. This image is positively transferred onto an adhesive layer on a printing object for forming a fine image. A repetition of this process constitutes a mass-production system for fine image forming.

As will have been apparent from the foregoing description, the electrodeposited substance image on the printing plate in the practice of the present invention may exhibit a hard or rigid nature or soft nature. The important point is that, by the practice of this invention, a good film-forming property can be obtained. By this good film-forming property, fine image elements (lines) of the order of μms can be transferred safely onto a printing object without breakage of the image elements. That is, transferred image elements of high quality without defects such as pinholes, broken lines, and short circuits can be formed.

The present invention has the following features of beneficial effect and utility.

A characteristic of the method of forming fine patterns of this invention is that electrodeposition is used for static inking. Accordingly, by carrying out beforehand patterning accurately and positively on a base plate surface through the use of an electrically insulative photoresist, an accurate and fine reproduction of that pattern can be obtained. This advantage has already been amply proved by the photoelectroforming method. In the method of forming fine patterns of this invention, an erosion resistant transferred pattern is formed by utilizing electrodeposition, and etching is carried out with this pattern as a masking material. This method has the advantage of being capable of forming an accurate duplicate pattern cf the original plate. Furthermore, since the original plate can be used repeatedly, the work efficiency is high, and a low-cost pattern forming process can be provided.

The electrodeposition substance is not limited to metals, as mentioned hereinbefore, other materials being usable in a similar manner. Examples of such other materials are substances that are ionic in liquids, such as organic substances and high polymers, and substances tending to deposit on an electrode surface because of reaction or some other action with electrolysis components in the vicinity of the electrode.

The film thickness of an electrodeposition substance depends on the electric energy, and its control is extremely easy in comparison with the control of physical inking according to a conventional printing method.

In the case where image elements are constituted by resist or the like, the sidewise growth of the depositing of the electrodeposited substance is restrained by the resist side wall. For this reason, the electrodeposition is carried out faithfully to the resist pattern. Therefore, provided that the resist image elements are formed with good dimensional precision, the electrodeposited image elements also will duplicate them faithfully. Thus a fine pattern is formed with good dimension precision.

As described above, the present invention provides a method of forming fine patterns by which, even when the image elements (lines) on the printing plate are fine elements of the order of 1 to 2 μm in width, fine patterns can be printed with high precision and moreover on a quantity-production scale by appropriately selecting the electrodeposition substance.

In order to indicate more fully the practical nature of this invention, the following examples of practice thereof are set forth, it being understood that these examples are presented as illustrative only and are not intended to limit the scope of the invention.

EXAMPLE 1

A 0.2-mm stainless-steel plate of substantially mirror-finish surface was coated by a rotation coating method with an aqueous photosensitive solution containing as its principal ingredients polyvinyl alcohol (PVA) and ammonium dichromate. The coating thickness after drying was 1.0 μm. The desired thin-line pattern was exposed to light, and water development at 30° C. was carried out. Thereafter, drying was carried out, and a heat treatment (burning) at 230 to 260° C. was further carried out for approximately 10 minutes. The water resistance and the electrical insulative property of the plate were reinforced, whereupon a printing plate was obtained.

Next, with a Ni plate as anode and the printing plate as cathode, the uncoated, electroconductive image-element parts of the printing plate were nickel plated.

The Ni plating conditions were as follows. Ni plating bath composition

| | |
|---|---|
| Ni sulfate | 240 to 340 g/l |
| Ni chloride | 45 g/l |
| boric acid | 30 to 38 g/l |
| pH | 2.5 to 5.5 |
| temperature | 46 to 70° C. |
| current density | 2.5 to 10 A/cm$^2$ |

The Ni plating was carried out to a plating thickness of 1 μm at completion. The printing plate was washed and dried.

Separately, a printing object comprising a glass base plate and a thin film of amorphous silicon (hereinafter referred to as a-Si) formed on the base plate was fabricated. The surface of the a-Si was coated with a tacky adhesive solution of a vinyl chloride acetate resin to a thickness of approximately 1 μm to form an adhesive layer.

The adhesive layer thus formed of the printing object and the Ni-plated surface of the printing plate were pressed together into a fully intimate contact. Then the printing object and the printing plate were pulled apart, whereupon the Ni-plated layer was found to be adhering completely to the adhesive layer of the printing object, and the Ni-plated image was thus transferred onto the printing object. The image element parts on the printing plate side could be replated since the original base plate surface was bare.

Next, the tacky adhesive of the non-image-element parts of the printing object having the Ni-plated image was carbonized in an oxygen plasma and removed, thereby exposing the a-Si surface. It was confirmed that the image element parts, being protected by the Ni-plated layer, had remained together with the adhesive layer corresponding to the image.

Next, the plasma gas was changed to argon gas in which freon gas had been admixed, and treatment was carried out with activated fluorine gas. The exposed a-Si layer was removed by dry etching. It was confirmed that the a-Si of the image element parts had remained as a result of the masking effect of the Ni-plated layer.

The printing object was then immersed in methyl ethyl ketone (MEK) at 40° C., and, by causing the tacky adhesive to expand or dissolve, it was removed together with the Ni-plated layer of the surface. Thus an image of a-Si thin film was formed on the surface of the printing object.

The minimum element (line) width of the finished image elements of this image of a-Si thin film was of the order of 3 μm. The deviation of the image element width was less than 1 μm.

The printing plate was made replateable by transferring the Ni-plated image. This printing plate was again Ni plated and used repeatedly. It was confirmed that the number of repetitions of use amounted to several tens of times and that a process similar to ordinary printing could be carried out.

EXAMPLE 2

A Cu plate of 1-mm thickness was prepared. Its surface was coated with a photoresist KOR (product name of Tokyo Oka Kabushiki Kaisha, Japan). Then, a specific fine pattern was exposed to light, developed, and dried.

Then, with an aqueous solution of iron chloride, etching of the non-masked parts to a depth of 10 μm was carried out.

Next, the photoresist was peeled off, and the entire surface was plated with hard Cr. Further, the recessed parts obtained by etching were filled with an epoxy-base thermosetting adhesive of high electrical insulative resistance and moreover high adhesive strength, which was then thermoset. The Cu plate surface was ground to smoothen evenly the hard Cr-plated surface and the recess-filling adhesive surface. Thus a printing plate was obtained.

For the plating of a metal pattern, the same Ni plating as in Example 1 was used. A Ni thin-film image being formed on the hard Cr surface. The transferring process thereafter of the Ni metal image onto the printing object was carried out similarly as in Example 1.

For the adhesive, an adhesive of photopolymerization type having an acrylate monomer and a photopolymerization initiator as principal ingredients was used. For the acrylate monomer, 2-ethylhexylacrylate, 1,4-butanediol diacrylate, or the like can be used. For the photopolymerization initiator, benzoyl peroxide or the like can be used.

The dimensional precision of the metal transferred image thus obtained was found to be of the same value as in Example 1. It was confirmed that an image of amply satisfactory quality had been obtained.

After the Ni image was transferred, the steps of exposing the printing object to ultraviolet rays, setting the non-image-element parts without Ni, and then developing by immersion in xylene were carried out. As a result, the parts which had not set under the Ni image elements dissolved, and simultaneously the Ni image was also removed, whereby a set adhesive pattern was formed. With this as an etching resist, an a-Si thin film was etched similarly as in Example 1.

The capability of the printing plate of being used repeatedly was remarkably increased. That is, the number of printing operations which the plate could withstand was several hundreds of times. This excellent performance is due to the strong adhesiveness of the adhesive, the plating of the image element parts with hard Cr, and the level nature of the image element parts and the non-image-element parts. It was thus verified that, by selecting an appropriate adhesive insulation agent, a printing plate of high printing-withstanding capability can be obtained.

EXAMPLE 3

The printing plate of Example 1 was used. With this printing plate as anode, electrodeposition at room temperature was carried out at a voltage of 100 to 150V with an aqueous solution of 10% by weight of solid component of polyester melamine resin as the electrolyte. The thickness of the resulting electrodeposited film was 2 μm. This film was immediately washed with water and dried.

Separately, a printing object was prepared by forming an a-Si film of 0.15 μm on a glass base plate. The a-Si surface of this printing object was coated with a tacky adhesive of vinyl chloride acetate type to a coating thickness of 1 μm. The resulting coated surface and the electrodeposited film surface were pressed together and then pulled apart. The pattern of the polyester melamine resin was thus perfectly transferred onto the a-Si layer surface.

Similarly as in Example 1, the tacky adhesive of the non-image-element parts and the a-Si layer were removed by etching in an oxygen plasma and a freon plasma. Then the tacky adhesive and the Ni of the image parts were similarly removed, whereby an etching pattern of a-Si was obtained.

The possibility of repeated use of the resulting printing plate was confirmed.

EXAMPLE 4

A Ni-plated thin film of a thickness of 0.4 μm was formed on the electroconductive image surface on the printing plate of Example 1. An electrolyte was prepared by diluting with 100 parts of water 10 parts of a coating solution comprising 70 percent by weight of a water-soluble polyester resin/a water-soluble melamine resin (40 parts by weight/80 parts by weight) and 30 percent by weight of Cellosolve (a trade name for ethylene glycol monoethylether). With the use of this electrolyte, a high polymer layer of 3-μm was formed by electrodeposition on the Ni thin film. The electrolysis conditions were a temperature of 25° C., a voltage of 20V, and the use of the printing plate as the anode.

After the electrolysis, washing with water and drying were carried out. Then, setting by baking at 175° C. for 30 minutes was carried out.

The electrodeposited film thus assumed a finished state of hard film. This film was firmly adhering to the Ni thin film, but since the Ni thin film could be readily peeled off the stainless-steel base plate, transferring was readily performed onto the glass plate having the tacky layer as in the preceding examples.

In this case, the electrodeposited film has already become a hard film. Therefore, even when pressing with a large force was carried out at the time of transferring, there was no deformation whatsoever of the transferred image elements, whereby an accurate duplication of the image elements was possible.

After transfer, the Ni film was removed by etching with a $FeCl_3$ solution. Further, with the residual set resin film as an erosion resistant resist, the Si thin film was similarly dry etched. As a result, a good Si pattern image was obtained.

The residual resist after etching was removed with a thermal film stripping solution containing concentrated sulfuric acid as its principal ingredient. Ample washing was carried out as the finishing step.

What is claimed is:

1. A method of forming fine patterns which comprises:
    forming a prescribed mask pattern with an electrically insulative material on a surface of a base plate, at least said surface having electroconductivity, thereby to form a printing plate having an electroconductive printing pattern parts;
    carrying out electrolysis in an electrolyte containing an electrodeposition substance as an ingredient, with said printing plate as a first electrode and an opposing second electrode both immersed in said electrolyte thereby to deposit said electrodeposition substance on said electroconductive printing pattern parts of the printing plate;
    then withdrawing said printing plate out from said electrolyte;
    thereafter transferring said deposited electrodeposition substance onto the surface of a printing object to be printed for forming a pattern on the object; and
    then etching the surface of said printing object by using the electrodeposition substance thus transferred as an erosion resistant material.

2. The method of forming fine patterns as claimed in claim 1, further comprising the step of: washing and drying the printing plate surface after withdrawing the printing plate out from the electrolyte.

3. The method of forming fine patterns as claimed in claim 1, further comprising the steps of: forming an adhesive or tacky film on the surface of said printing object or on the printing plate surface on which said electrodeposition substance has been deposited; thereafter transferring said deposited electrodeposition substance directly onto said printing object surface; then removing by etching the adhesive film of non-image-element parts by using the electrodeposition substance thus transferred as an erosion resistant material; and further etching the printing object surface.

4. The method of forming fine patterns as claimed in claim 1, wherein, prior to the depositing of said electrodeposition substance, electric voltage is applied beforehand across said printing plate as a first electrode and said opposing second electrode both immersed in an electrolyte containing a substance having good peelability to deposit said substance having good peelability on said electroconductive printing pattern parts of said printing plate thereby to facilitate the transferring of said electrodeposition substance deposited on the printing plate surface onto the printing object surface.

5. The method of forming fine patterns as claimed in claim 1, wherein the electrodeposition substance deposited on the printing plate surface is a metal film.

6. The method of forming fine patterns as claimed in claim 1, wherein the electrodeposition substance deposited on the printing plate surface is a coated film of an organic substance.

7. The method of forming fine patterns as claimed in claim 1, wherein the electrodeposition substance deposited on the printing plate surface is a resist film possessing erosion resistance.

* * * * *